United States Patent [19]

Sarkozy

[11] Patent Number: 4,556,584
[45] Date of Patent: Dec. 3, 1985

[54] METHOD FOR PROVIDING SUBSTANTIALLY WASTE-FREE CHEMICAL VAPOR DEPOSITION OF THIN-FILM ON SEMICONDUCTOR SUBSTRATES

[75] Inventor: Robert F. Sarkozy, Westford, Mass.

[73] Assignee: BTU Engineering Corporation, North Billerica, Mass.

[21] Appl. No.: 606,769

[22] Filed: May 3, 1984

[51] Int. Cl.$^4$ ............................................. B05D 3/06
[52] U.S. Cl. ................................. 427/54.1; 427/82; 427/93; 427/248.1; 427/255; 427/255.3; 427/331
[58] Field of Search ..................... 427/82, 54.1, 86, 99, 427/248.1, 93, 255, 255.3, 331

[56] References Cited

U.S. PATENT DOCUMENTS

| | | | |
|---|---|---|---|
| 3,745,043 | 7/1973 | Bradley | 427/86 |
| 3,900,597 | 8/1975 | Chruma et al. | 427/255 |
| 4,421,786 | 12/1983 | Mahajan et al. | 427/255 |

Primary Examiner—S. L. Childs
Attorney, Agent, or Firm—Weingarten Schurgin, Gagnebin & Hayes

[57] ABSTRACT

A method is disclosed for providing substantially effluent-waste free vacuum chemical vapor deposition of thin-film on semiconductor substrates. A first comparatively low efficiency diffusion furnace deposits selected thin-film on the semiconductor substrates. A second comparatively high-efficiency diffusion furnace operative in response to the effluent-waste stream of the first diffusion furnace deposits substantially all of the effluent-waste on throw-away baffles.

7 Claims, 6 Drawing Figures 4,556,584

METHOD FOR PROVIDING SUBSTANTIALLY WASTE-FREE CHEMICAL VAPOR DEPOSITION OF THIN-FILM ON SEMICONDUCTOR SUBSTRATES

FIELD OF THE INVENTION

This invention is directed to the field of integrated circuit fabrication, and more particularly, to novel method and apparatus for providing substantially wastefree vacuum chemical vapor deposition (V-CVD) of thin-film on semiconductor substrates.

BACKGROUND OF THE INVENTION

Semiconductor substrates are typically batch processed in vacuum chemical vapor deposition (V-CVD) diffusion furnaces to form a thin-film of selected characteristics on the semiconductor substrates during the various phases of the integrated circuit fabrication processes. The batch of substrates to be processed is removably disposed into a longitudinally extending reaction chamber maintained at a selected temperature and vacuum condition for the particular V-CVD process being run, and one or more reactants in gas phase are controllably injected into the longitudinally extending reaction chamber via gas injectors. A portion of the one or more reactants in gas phase pyrolytically decomposes and is surface catalyzed by the substrates to deposit intended thin-film in solid phase thereon. Another portion of the one or more reactants in gas phase is surface catalyzed by the surfaces of the reaction chamber and gas injectors to deposit material thereon that must be removed at regular intervals during which the V-CVD diffusion furnace is inoperative for routine down-time cleaning. Reference may be had to co-pending application Ser. No. 552,454, entitled MODULAR V-CVD DIFUSION FURNACE, invented by the same inventive entity and assigned to the same assignee as the instant invention, incorporated herein by reference, for its disclosure of a novel diffusion furnace operative to extend the interval between routine down-time cleaning by a factor of between 20 and 50 over the theretofore known furnaces. The remaining portion of the one or more reactants in gas phase, typically the major portion of the reactants injected into the reaction chamber, is discharged as a waste-effluent stream that forms into flaky, porous, and powdery deposits in the vacuum system itself.

Typically, from 70 to 85% of the one or more reactants in gas phase injected into the reaction chamber exit as a waste-effluent stream into the vacuum system. This commonly necessitates cleaning the filter of the vacuum system once per shift, and necessitates changing the oil of the vacuum system once every several shifts. These oil and filter changes are not only messy, particularly in view of the clean-room environment in which the CVD processes are run, but also are disadvantageous due to the labor and materials costs incurred for each such change. Moreover, the vacuum pump itself must commonly be changed at least on a quarterly basis. Not only are considerable labor and material costs incurred in changing the vacuum pump, but it commonly takes approximately from one-half to one shift to replace the pump, and approximately another one-half shift to once again start up the CVD processes, during which times the furnace is inoperable with consequent loss of revenues and material throughput.

SUMMARY OF THE INVENTION

The novel method and apparatus for providing substantially effluent-waste free V-CVD of thin-film on semiconductor wafers of the present invention contemplates a first diffusion furnace having an effluent-waste stream for depositing selected thin-film on semiconductor substrates removably disposed in the first diffusion furnace, and an in-line second diffusion furnace coupled in fluid communication with the first diffusion furnace for depositing substantially all the effluent-waste stream of the first diffusion furnace on baffles removably disposed in the second diffusion furnace prior to the vacuum system. The in-line first and second diffusion furnaces of the present invention thereby result in more economical vacuum chemical vapor deposition of thin-film on semiconductor substrates. The present invention subtantially eliminates the need to regularly maintain and replace the vacuum system together with its consequent down-time like in the heretofore known CVD systems, and significantly improves material processing throughput capability with attendant revenue generation typically paying for itself within the first quarter of its operation.

The novel method and apparatus for providing substantially wast-free vacuum chemical vapor deposition of thin-film on semiconductor wafers of the present invention in preferred embodiment includes a first V-CVD diffusion furnace, preferably of the type disclosed in the above-identified co-pending application, for depositing intended thin-film on vertically oriented semiconductor substrates, and an ultraviolet enhanced vacuum chemical vapor deposition (UV-CVD) diffusion furnace coupled downstream of the first V-CVD diffusion furnace and upstream of a common vacuum system for depositing substantially all of the effluent-waste stream on baffles prior to the vacuum system. The UV-CVD diffusion furnace substantially traps the effluent-waste stream of the first diffusion furnace thereby substantially eliminating the need for regular maintenance and replacement of the vacuum system. Any other suitable low-efficiency V-CVD diffusion furnace for depositing intended thin-film on semiconductor substrates and any other suitable high-efficiency V-CVD diffusion furnace for depositing the effluent-waste stream of the upstream diffusion furnace on suitable baffles provided therefor can be employed as well without departing from the inventive concept.

BRIEF DESCRIPTION OF THE DRAWINGS

Other advantages and features of the present invention will become apparant as the invention becomes better understood by referring to the following exemplary and non-limiting detailed description of the preferred embodiment, and to the drawings, wherein.

DETAILED DESCRIPTION OF THE PREFERRED EMBODIMENT

Figure 1:
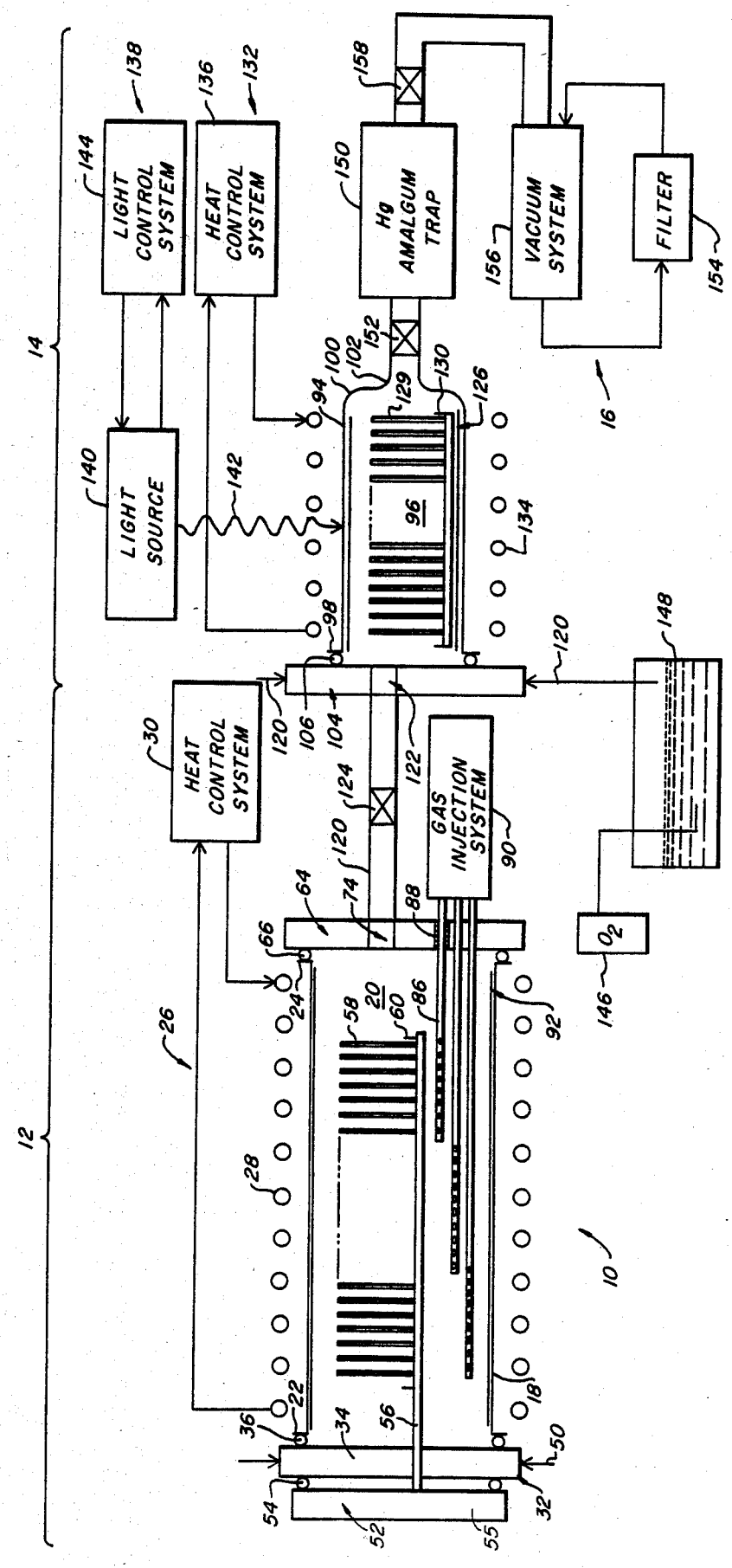
FIG. 1 is a not-to-scale pictorial diagram illustrating the novel method and apparatus for providing substantially waste-free vacuum chemical vapor deposition (V-CVD) of thin-film on semiconductor substrates according to the present invention.

Referring now to FIG. 1, generally designated at 10 is a not-to-scale pictorial diagram illustrating the apparatus and method for providing substantially waste-free vacuum chemical vapor deposition (V-CVD) of thin-film on semiconductor substrates according to the present invention. The system 10 includes a first, comparatively low-efficiency thin-film deposition stage designated by a bracket 12 to be described for depositing selected thin-film on semiconductor substrates, and a second comparatively high-efficiency effluent-waste stream removing stage designated by a bracket 14 to be described downstream of the stage 12 for depositing substantially all of the effluent-waste stream produced by the deposition stage 12 onto disposable baffles provided therefor. A common vacuum system generally designated 16 for the stages 12, 14 is provided for maintaining a selected vacuum condition in the stages 12, 14. As appears more fully below, the stage 14 removes substantially all of the effluent-waste stream produced by the deposition stage 12 prior to the vacuum system 16 thereby substantially eliminating the need to maintain, repair, and replace the vacuum system 16.

The stage 12 includes a diffusion tube 18 having open ends defining a longitudinally extending cylindrical reaction chamber 20. The tube 18 is preferably symmetrically shaped, and is fastened from any suitable high-temperature material such as quartz. Annular quartz flanges 22, 24 are integrally formed on the tube 18 respectively surrounding the open ends thereof.

A heating system generally designated 26 is coupled to the diffusion tube 18 for controllably maintaining a selected temperature in the reaction chamber 20. The heating system 26 preferably includes a resistance element 28 coiled peripherally around the diffusion tube 18 that is connected to a heat control system 30. The heat control system 30 is operative in known manner to selectively energize the coil 28 to establish an intended temperature in the chamber 20. One or more thermocouples, not shown, are positioned in the chamber 20 and electrically connected to the heat control system 30 to precisely maintain a selected temperature in the chamber 20 to within a selected tolerance.

Figure 2:
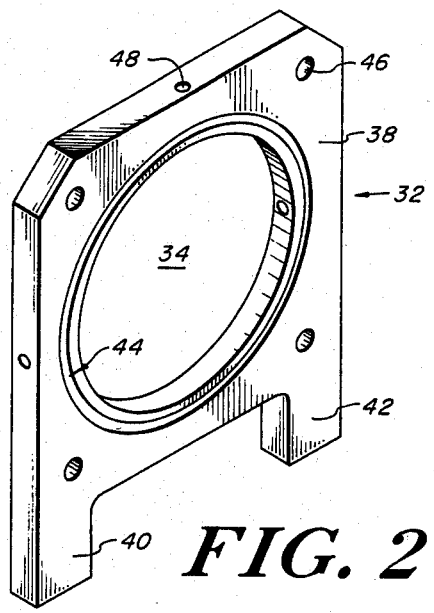
FIG. 2 is a perspective view illustrating a component of FIG. 1.

A first door generally designated 32 having a central aperture 34 is removably fastened in air-tight sealing engagement with the annular flange 22 via an O-ring 36. As best seen in FIG. 2, the door 32 includes a plate 38, preferably fashioned from any suitable metal such as stainless steel, having upstanding integral spaced support legs 40, 42. An annular groove generally designated 44 is provided circumferentially around the central aperture 34 that is dimensioned to accept the O-ring 36 (FIG. 1). A plurality of apertures 46 are provided peripherally around the groove 44 and through the plate 38 to provide mounting openings for removably fastening the plate 38 to the flange 22 (FIG. 1). A plurality of radially extending apertures 48 defining gas injection ports are provided through the circumferential wall of the door 32 that are individually in communication with the chamber 20 (FIG. 1) for controllably injecting reactant in gas phase thereinto as illustrated at 50 (FIG. 1).

A boat loader generally designated 52 is removably fastened in air-tight sealing engagement with the first door 32 via an O-ring 54. The boat loader 52 includes a plate 55 having a longitudinally extending cantilevered arm 56. Although a cantilevered arm is specifically illustrated, it will be appreciated that carriage-type and wheelbarrel-type arms can be employed as well. A plurality of semiconductor substrates 58 are supported in a boat 60 of conventional design in longitudinally spaced-apart relation, with the plane of the substrates being generally coincident with the vertical plane. The plate 55 of the boat loader 52 is connected to a motor that controls its translation, not illustrated, for inserting the arm 56 into the reaction chamber 20 and for removing the arm 56 out of the reaction chamber, and therewith the boat-loaded substrates 58.

Figure 3:
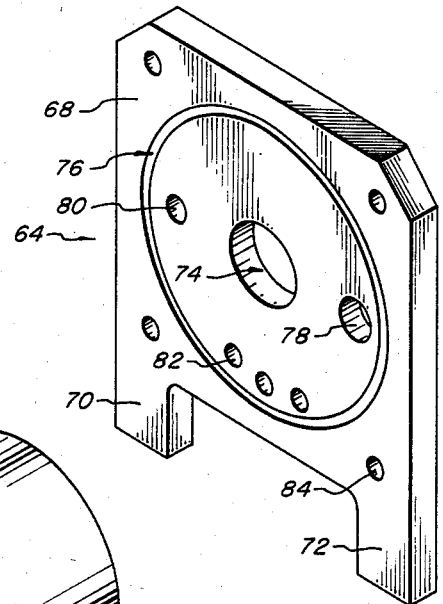
FIG. 3 is a perspective view illustrating another component of FIG. 1.

A second door generally designated 64 is removably fastened to the annular flange 24 in air-tight sealing engagement therewith via an O-ring 66. As best seen in FIG. 3, the door 64 includes a plate 68, preferably fashioned from any suitable metal such as stainless steel, having upstanding integral spaced support legs 70, 72. The plate 68 is provided with a central aperture generally designated 74 to be described, and an annular groove generally designated 76 surrounding the aperture 74 adapted to accept the O-ring 66 (FIG. 1). A bore 78 intermediate the groove 76 and the aperture 74 is provided for connection to a vacuum monitoring device, not illustrated; a bore 80 intermediate the groove 76 and the aperture 74 is provided for connection to a temperature monitoring device, not illustrated; and three precisely aligned gas injection tube receiving apertures 82 intermediate the groove 76 and the bore 74 are provided for receiving gas injection tubes to be described. A plurality of apertures 84 are provided peripherally around the groove 76 and through the plate 68 to provide mounting openings for removably fastening the plate 68 to the annular flange 24 (FIG. 1).

A plurality of gas-injection tubes 86 are slidably mounted through the precisely aligned apertures 82 (FIG. 3), and are held in air-tight sealing engagement with the confronting walls of the openings 82 by any suitable gasket 88 such as an Ultra-Torr fitting commercially available from Cambridge Valve & Fitting Company, Cambridge, Mass. Each of the injection tubes 86 are operatively connected to a gas-injection system 90 operative to controllably introduce one or more preselected reactants in gas phase into the reaction chamber 20 selected for any one of various V-CVD processes well-known to those skilled in the art.

Figure 4:
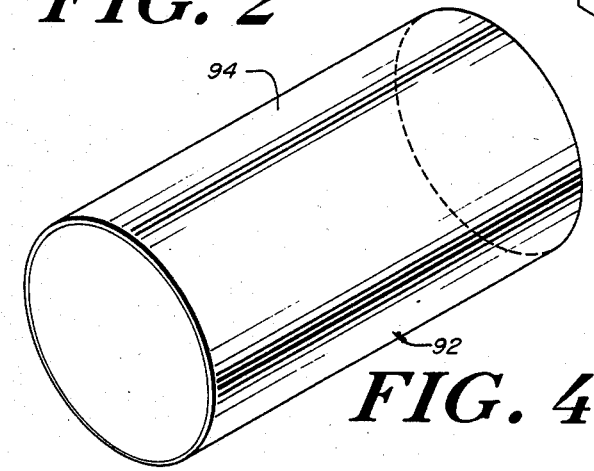
FIG. 4 is a perspective view illustrating a further component of FIG. 1.

A liner generally designated 92 is slidably inserted in the diffusion tube 18. As can best be seen in FIG. 4, the liner 92 preferably includes a cylinder 94 having open ends fashioned from any suitable high-temperature material such as quartz. The dimension of the cylinder 94 is selected to be just less than the longitudinal dimension of the diffusion tube 18, and has an outside diameter selected to be just less than the inside diameter of the cylindrical diffusion tube 18.

The second stage 14 includes a diffusion tube 94, fashioned from any suitable high-temperature resistant material such as quartz, defining a horizontally extending reaction chamber 96. An upstanding flange 98 is integrally formed on one end of the tube 94, and a neck 100 that tapers to a throat 102 is integrally formed on the other end of the diffusion tube 94.

Figure 5:
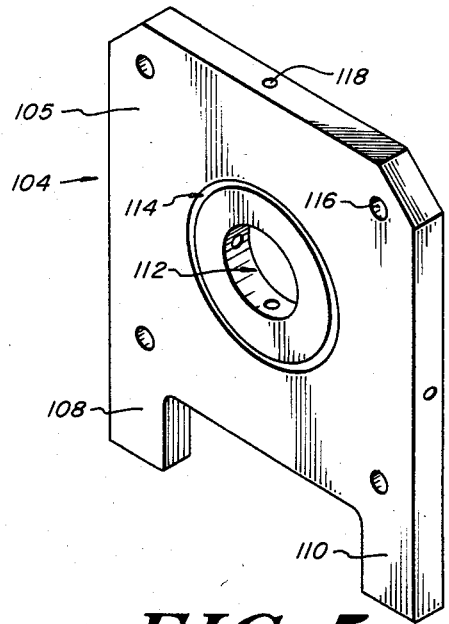
FIG. 5 is a perspective view illustrating another component of FIG. 1.

A third door generally designated 104 is removably fastened to the annular flange 98 in air-tight sealing engagement therewith via an O-ring 106. As best seen in FIG. 5, the door 104 includes a plate 105, preferably fashioned from any suitable metal such as stainless steel, having upstanding integral spaced support legs 108, 110. The plate 105 includes a central aperture generally designated 112 to be described, an annular groove generally designated 114 surrounding the aperture 112 adapted to accept the O-ring 106 (FIG. 1), and a plurality of apertures 116 peripherally around the groove 114 that provide mounting openings for removably fastening the plate 106 to the annular flange 98 (FIG. 1). A plurality of radially extending ports 118 are provided through the circumferential wall of the door 104 that are individually in communication with the chamber 96 (FIG. 1) for controllably injecting reactant in gas phase thereinto as illustrated at 120 (FIG. 1).

A vacuum conduit 122 is fastened to the apertures 74, 112 of the doors 64, 104 in air-tight sealing engagement therewith. The vacuum conduit 122 provides fluid communication between the chambers 20, 96 of the diffusion tubes 18, 94 respectively. A valve 124 is provided along the vacuum conduit 122.

Figure 6:
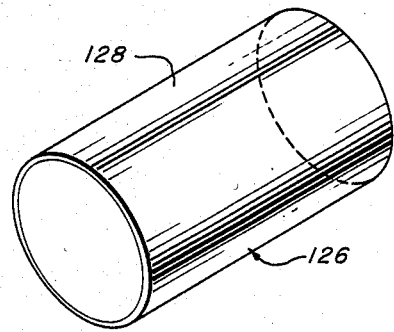
FIG. 6 is a perspective view illustrating another component of FIG. 1.

A liner generally designated 126 is slidably inserted into the diffusion tube 94. As best seen in FIG. 6, the liner 126 preferably includes a cylinder 128 having open ends fashioned from any suitable high-temperature material such as quartz. The dimension of the cylinder 128 is selected to be just less than the longitudinal dimension of the diffusion tube 94, and has an outside diameter selected to be just less than the inside diameter of the tube 94.

A plurality of upstanding baffles 129 are supported by a member 130 in longidutinally spaced-apart relation, with the plane of the baffles being generally coincident with the vertical plane. The baffles 129 and the support 130 may be semiconductor substrates supported on a conventional boat, although any other suitable baffles and baffle support may be employed as well without departing from the inventive concept. In the exemplary embodiment, the support 130 is slidably inserted in the reaction chamber 96 and rests on the confronting surface of the liner 126, but may be supported thereoff by any suitable means, not illustrated.

A heating system generally designated 132 is coupled to the diffusion tube 94 to controllably maintain a selected temperature in the reaction chamber 96. The heating system 132 preferably includes a resistance element 134 coiled peripherally around the diffusion tube 94 that is connected to a heat control system 136. The heat control system 136 is operative in known manner to selectively energize the coil 134 to establish an intended temperature in the reaction chamber 96. One or more thermocouples, not shown, are positioned in the chamber 96 and electrically connected to the heat control system 136 to precisely maintain a selected temperature in the chamber 96 to within a selected tolerance.

A light source generally designated 138 is coupled to the diffusion tube 94 for controllably exciting the reaction chamber 96 at one or more preselected wavelengths. The light source 138 includes a plurality of selected wavelength, high-intensity lamps 140 circumferentially disposed around the diffusion tube 94, only one of which is specifically illustrated. Photons schematically illustrated at 142 pass through the quartz diffusion tube 94 into the reaction chamber 96. A light source control system 144 is connected to the lamps 140 for monitoring their temperature and for controlling the voltage and current applied thereto for establishing and maintaining photon excitation of the wavelength selected for the particular CVD process.

Excess oxygen 146 is bubbled through a mercury reservoir 148 and injected through the gas ports 120 into the reaction chamber 96. For the exemplary mercury-sensitized photochemical (UV-CVD) process, the light source 138 is operative to produce light at the wavelength of mercury vapor, substantially 2537 Å. It will be appreciated by those skilled in the art that other photosensitizers, such as thalium, zenon, cadmium, and zinc, and light at the corresponding wavelength, can be employed as well without departing from the inventive concept.

A mercury amalgum trap 150 is coupled to the neck 102 of the diffusion tube 94 via a ball valve 152. The vacuum system 16 includes an oil filter 154 operatively connected to a vacuum pump 156 that is connected via a ball valve 158 to the trap 150.

In exemplary operation of the system 10 to provide substantially waste-free vacuum chemical vapor deposition of $SiO_2$ thin-film on the plurality of substrates 58 positioned in the reaction chamber 20 of the diffusion furnace 18, the vacuum control system is operative to maintain the pressure in the stages 12, 14 typically at 300 to 400 microns, the gas injection system 90 is operative to inject silane ($SiH_4$) through the injection tubes 86 into the reaction chamber 20, and oxygen is injected via the gas ports 50 of the door 32 into the reaction chamber 20. The heating control system 30 is operative to produce a uniform temperature in the reaction chamber 20 of about 400°–450° Centigrade. The heating control system 136 maintains an exemplary uniform temperature in the reaction chamber 96 of the downstream diffusion furnace 94 from 75° to 300° Centigrade. Mercury sensitilized oxygen is injected into the chamber 96 via the ports 120 and the light system 138 is operative to produce light at the 2537 Å line for mercury.

A portion of the reactants in gas phase injected into the stage 12, typically 15 to 30%, pyrolytically decompose in the furnace 18 and deposit intended thin-film on the wafers 58, as well as on the liner 92 and gas injection tubes 86. The remaining portion of the reactants in gas phase, typically from 70 to 85% thereof, form an effluent-waste stream that is discharged downstream of the diffusion tube 18 via the vacuum coupling 122 and into the stage 14. This effluent-waste stream and the photosensitized oxygen injected into the reaction chamber 96 photochemically react and pyrolytically decompose depositing substantially all of the effluent-waste stream onto the baffles 129. It should be noted that any prereacted particulate material contained in the effluent-waste stream is physically filtered by the baffle assembly in the stage 14. In this manner, the vacuum system 16 can be operated substantially continuously, without having to change the filter 154, the oil, or the vacuum pump 156. Thus, materials processing for vacuum system maintenance is not interrupted and significantly enhanced revenue is generated. The system 10 typically pays for itself within the first quarter of its operation.

The batch of coated substrates 58 is then removed from the diffusion furnace 18, and the same or another process is run on another batch of substrates. In the case where the liner 92 or the liner 126 needs to be removed for cleaning, the corresponding door 52, 104 is unfastened from its flange, and the soiled liner is slidably removed and replaced by a clean liner without further system disconnection. Soiled gas-injection tubes 86 are likewise expeditiously disconnected and clean tubes reconnected again without requiring disconnection from the vacuum or heating systems.

Many modifications of the presently disclosed invention will become apparent to those skilled in the art without departing from the scope of the appended claims. It will be appreciated that the significantly enhanced materials processing throughput capability of the exemplary embodiment can be achieved by any suitable combination of low-efficiency and downstream high-efficiency stages other than that specifically illustrated without departing from the inventive concept.

What is claimed is:

1. A method for providing substantially waste-free chemical vapor deposition (CVD) of thin-film on semiconductor substrates, comprising the steps of:
    depositing selected thin-film on semiconductor substrates in a first chemical vapor deposition (CVD) reaction chamber of a diffusion furnace by a first comparatively low-efficiency CVD reaction that produces a substantial effluent-waste stream; and
    depositing substantially all of the effluent-waste stream on the surfaces of elements provided therefor by a second comparatively high-efficiency CVD reaction different from the first comparatively low-efficiency CVD reaction in a second chemical vapor deposition diffusion furnace.

2. The method of claim 1, further including the step of removing the semiconductor substrates from the reaction chamber after the thin-film is deposited thereon.

3. The method of claim 2, wherein said reaction chamber is defined in a vacuum chemical vapor deposition (V-CVD) diffusion furnace.

4. The method of claim 1, futher including the step of disposing of the elements after the effluent-waste stream has been deposited thereon.

5. The method of claim 4 wherein, said reaction chamber is defined in a ultraviolet chemical vapor deposition (UV-CVD) diffusion furnace.

6. A method for substantially eliminating the effluent-waste of a vacuum chemical vapor deposition diffusion furnace of the type that deposits selected thin-film on semiconductor substrates by a first comparatively low-efficiency vacuum chemical vapor deposition reaction that produces a considerable effluent-waste stream consisting of excess unreacted reactants in gas phase, comprising the steps of:
    directing the effluent-waste stream into a reaction chamber of another vacuum chemical vapor deposition furnace; and
    depositing substantially all of the effluent-waste stream on disposable material positioned in the reaction chamber by a second comparatively high-efficiency chemical vapor deposition reaction.

7. The method of claim 6, wherein said high-efficiency chemical vapor deposition reaction is a photo-sensitized vacuum chemical vapor deposition reaction.

* * * * *